(12) United States Patent
Cojocneanu et al.

(10) Patent No.: US 11,594,435 B2
(45) Date of Patent: Feb. 28, 2023

(54) APPARATUS AND METHODS FOR TESTING SEMICONDUCTOR DEVICES

(71) Applicant: Testmetrix, Inc., Milpitas, CA (US)

(72) Inventors: Christian O. Cojocneanu, Milpitas, CA (US); Lucian Scurtu, Codlea Brasov (RO)

(73) Assignee: Testmetrix, Inc., San Jose, CA (US)

( * ) Notice: Subject to any disclaimer, the term of this patent is extended or adjusted under 35 U.S.C. 154(b) by 0 days.

(21) Appl. No.: 16/872,542

(22) Filed: May 12, 2020

(65) Prior Publication Data

US 2020/0273733 A1 Aug. 27, 2020

Related U.S. Application Data

(63) Continuation of application No. 15/864,778, filed on Jan. 8, 2018, now abandoned.
(Continued)

(51) Int. Cl.
*G01R 31/00* (2006.01)
*H01L 21/67* (2006.01)
(Continued)

(52) U.S. Cl.
CPC .... *H01L 21/67288* (2013.01); *G01R 31/2601* (2013.01); *G01R 31/2867* (2013.01);
(Continued)

(58) Field of Classification Search
CPC ............ G01R 31/2867; G01R 31/2868; G01R 31/2865; G01R 31/2886; G01R 31/2887;
(Continued)

(56) References Cited

U.S. PATENT DOCUMENTS

| 2009/0212803 A1* | 8/2009 | Yamamoto | G01R 31/2893 324/762.06 |
| 2010/0040441 A1* | 2/2010 | Obikane | H01L 21/67772 414/222.01 |

(Continued)

FOREIGN PATENT DOCUMENTS

| JP | 2016-032110 A | 3/2016 |
| JP | 2016-164982 A | 9/2016 |

*Primary Examiner* — Thang X Le
(74) *Attorney, Agent, or Firm* — Owens Law Firm, PC

(57) ABSTRACT

The invention is a cost effective multisite parallel wafer tester that has an array of stationary wafer test sites; a single mobile wafer handling and alignment carriage that holds a wafer handling robot, a wafer rotation pre-alignment assembly, a wafer alignment assembly, a wafer front opening unified pod (FOUP), and a wafer camera assembly; and a robot that moves the wafer handling and alignment carriage to and from each test site. Each test site contains a wafer probe card assembly and a floating chuck. In use, wafers are loaded from a front opening FOUP into a wafer buffer FOUP from which wafers are retrieved by the wafer handling and alignment assembly. The robot positions the wafer handling and alignment carriage and the associated wafer handling robot, the wafer rotation pre-alignment assembly, the wafer alignment assembly, the wafer FOUP, and the wafer camera assembly in front of and inside a given test site and aligns the wafer to be tested with the probe card inside the test site using the floating chuck.

14 Claims, 15 Drawing Sheets

Related U.S. Application Data

(60) Provisional application No. 62/443,712, filed on Jan. 8, 2017.

(51) Int. Cl.
*H01L 21/66* (2006.01)
*G01R 31/26* (2020.01)
*H01L 21/677* (2006.01)
*H01L 21/68* (2006.01)
*G01R 31/28* (2006.01)

(52) U.S. Cl.
CPC .... *G01R 31/2868* (2013.01); *H01L 21/67742* (2013.01); *H01L 21/68* (2013.01); *H01L 22/30* (2013.01); *G01R 31/2865* (2013.01)

(58) Field of Classification Search
CPC ............ G01R 31/2889; G01R 31/2891; G01R 31/2893; G01R 31/26; G01R 31/2601; G01R 1/0491; G01R 1/07314; G01R 1/07342; G01R 1/07378; G01R 1/06711; G01R 1/06722; G01R 1/06738; G01R 1/06772
USPC ..................................................... 324/756.02
See application file for complete search history.

(56) References Cited

U.S. PATENT DOCUMENTS

| | | | |
|---|---|---|---|
| 2011/0316571 A1* | 12/2011 | Kiyokawa | G01R 31/2893 324/750.16 |
| 2014/0160270 A1* | 6/2014 | Naito | G01R 31/2891 348/95 |
| 2015/0192607 A1* | 7/2015 | Amemiya | G01R 31/2601 324/756.03 |
| 2016/0133502 A1* | 5/2016 | Won | B25J 9/1679 901/46 |
| 2017/0001165 A1* | 1/2017 | Crnogorac | B05D 1/005 |
| 2018/0231582 A1* | 8/2018 | Sakai | H01L 21/677 |

* cited by examiner

APPARATUS AND METHODS FOR TESTING SEMICONDUCTOR DEVICES

CROSS-REFERENCE TO RELATED APPLICATIONS

This application is a continuation of prior application Ser. No. 15/864,778, filed, Jan. 8, 2018, which claims the benefit of provisional Application No. 62/443,712, filed Jan. 8, 2017. The entirety of each of the foregoing applications is incorporated by reference herein.

BACKGROUND OF THE INVENTION

Field of the Invention

The invention in its various embodiments relates generally to equipment for testing semiconductor devices, such as semiconductor wafers, and methods for such testing. In particular, the invention in its various embodiments relate to a multisite parallel tester for testing multiple semiconductor wafers concurrently.

Description of Related Art

The integrated circuits on semiconductor wafers are typically tested for functional defects prior to die packaging. It is desirable to perform such testing as efficiently and economically as possible. Therefore, there is a need for testing equipment that provides for efficient and economical testing of semiconductor wafers.

BRIEF SUMMARY OF THE INVENTION

Generally, the invention is a cost effective multisite parallel wafer tester that has an array of stationary wafer test sites; a single mobile wafer handling and alignment carriage that holds a wafer handling robot, a wafer rotation pre-alignment assembly, a wafer alignment assembly, a wafer front opening unified pod (FOUP), and a wafer camera assembly; and a robot that moves the wafer handling and alignment carriage to and from each test site. Each test site contains a wafer probe card assembly and a floating chuck. In use, wafers are loaded from a front opening FOUP into a wafer buffer FOUP from which wafers are retrieved by the wafer handling and alignment assembly. The robot positions the wafer handling and alignment carriage and the associated wafer handling robot, the wafer rotation pre-alignment assembly, the wafer alignment assembly, the wafer FOUP, and the wafer camera assembly in front of and inside a given test site and aligns the wafer to be tested with the probe card inside the test site using the floating chuck. Testing is then commenced and once completed, the wafer can be retrieved. The following description provides additional details about the various components of the tester and the methods used for aligning and testing a given wafer.

It should be appreciated that, in one embodiment, the tester leverages a single wafer handling and alignment carriage and the associated wafer handling robot, the wafer rotation pre-alignment assembly, the wafer alignment assembly, the wafer FOUP, and the wafer camera assembly over a two-dimensional array of test sites. In one embodiment, the tester is configured as a four-by-eight array of 32 test sites provided by four modular racks, each containing eight test sites from top to bottom. It should be appreciated, however, that other configurations are possible. The leveraging of a single wafer handling and alignment carriage and the associated wafer handling robot, the wafer rotation pre-alignment assembly, the wafer alignment assembly, the wafer FOUP, and the wafer camera assembly is achieved by means of a mobile design that can be moved using a Cartesian rack robot to place the assembly in position for servicing each individual test site. Thus, wafers are automatically aligned inside each test site and the entire array of test sites is capable of testing wafers in parallel, with the test sites containing only a probe card assembly and a floating chuck used to align and hold the wafer. The probe card has a large plurality of high resource gate arrays mounted on its back. These gate arrays contain the test engines that allow many wafers to be tested in one touchdown, without having to move the wafer to an additional test site, although it should be appreciated that the tester can be used for multiple touchdown applications as well. Thus, the invention is a cost effective way to test multiple wafers in parallel, with all die on the wafer tested in one touchdown or by employing multiple touchdowns. In cases of high die count wafers or high pinout dies, the wafer will still need to be tested in multiple touchdowns, but the multitude of test sites in the present invention makes this requirement cost effective compared to other solutions.

In one embodiment, a wafer probe card assembly contains a multistage seal and combines with the floating chuck to create a vacuum test chamber. The probe card integrates minimum-delay-test-engines with device-limited test times capabilities. A major cost savings is also achieved by the use of vacuum to compress the probe card contactor springs, without the need to perform stress relief via a convoluted stiffener structure mounted on the back side of the probe card, which would also make the mounting of all test engines on the back of the probe card prohibitive.

DETAILED DESCRIPTION OF THE INVENTION

Figure 1:
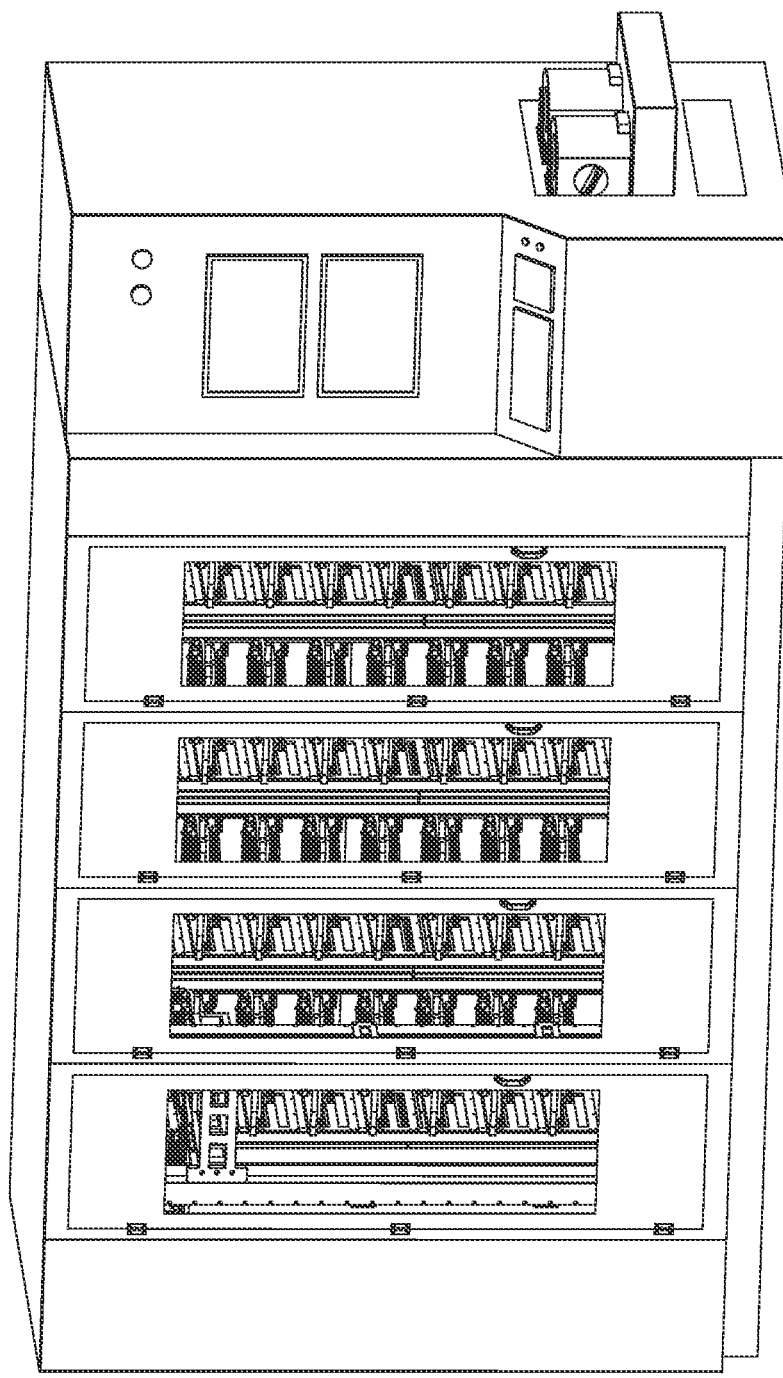
FIG. 1 illustrates a front view of a tester according to one embodiment of the present invention.

The present invention is more fully described below with reference to the accompanying Figures. While the invention will be described in conjunction with particular embodiments, it should be understood that the invention includes alternatives, modifications, and equivalents. Accordingly, the following description is exemplary in that several embodiments are described (e.g., by use of the terms "preferably," "for example," or "in one embodiment"), but this description should not be viewed as limiting or as setting forth the only embodiments of the invention, as the invention encompasses other embodiments not specifically recited in this description. Further, the use of the terms "invention," "present invention," "embodiment," and similar terms throughout this description are used broadly and are not intended to mean that the invention requires, or is limited to, any particular aspect being described or that such description is the only manner in which the invention may be made or used.

Generally, the invention is a cost effective multisite parallel wafer tester that has an array of stationary wafer test sites; a single mobile wafer handling and alignment carriage that holds a wafer handling robot, a wafer rotation pre-alignment assembly, a wafer alignment assembly, a wafer front opening unified pod (FOUP), and a wafer camera assembly; and a robot that moves the wafer handling and alignment carriage to and from each test site. Each test site contains a wafer probe card assembly and a floating chuck. In use, wafers are loaded from a front opening FOUP into a wafer buffer FOUP from which wafers are retrieved by the wafer handling and alignment assembly. The robot positions the wafer handling and alignment carriage and the associated wafer handling robot, the wafer rotation pre-alignment assembly, the wafer alignment assembly, the wafer FOUP, and the wafer camera assembly in front of and inside a given test site and aligns the wafer to be tested with the probe card inside the test site using the floating chuck. Testing is then commenced and once completed, the wafer can be retrieved. The following description provides additional details about the various components of the tester and the methods used for aligning and testing a given wafer.

It should be appreciated that, in one embodiment, the tester leverages a single wafer handling and alignment carriage and the associated wafer handling robot, the wafer rotation pre-alignment assembly, the wafer alignment assembly, the wafer FOUP, and the wafer camera assembly over a two-dimensional array of test sites. In one embodiment, the tester is configured as a four-by-eight array of 32 test sites provided by four modular racks, each containing eight test sites from top to bottom. It should be appreciated, however, that other configurations are possible. The leveraging of a single wafer handling and alignment carriage and the associated wafer handling robot, the wafer alignment assembly, the wafer FOUP, and the wafer camera assembly is achieved by means of a mobile design that can be moved using a Cartesian rack robot to place the assembly in position for servicing each individual test site. Thus, wafers are automatically aligned inside each test site and the entire array of test sites is capable of testing wafers in parallel, with the test sites containing only a probe card assembly and a floating chuck used to align and hold the wafer. The probe card has a large plurality of high resource gate arrays mounted on its back. These gate arrays contain the test engines that allow many wafers to be tested in one touchdown, without having to move the wafer to an additional test site, although it should be appreciated that the tester can be used for multiple touchdown applications as well. In cases of high die count wafers or high pinout dies, the wafer will still need to be tested in multiple touchdowns, but the multitude of test sites in the present invention makes this requirement cost effective compared to other solutions.

FIG. 1 illustrates a front view of a tester according to one embodiment of the present invention. As shown, the tester is basically a cabinet containing an array of test sites, each of which can receive a wafer for testing. In one embodiment, the array of test sites is organized as a set of four modular racks holding eight test sites from top to bottom, each of which can receive a wafer for testing. The cabinet provides access to each test site through the doors shown. A tester control station is also located adjacent to the test sites.

Figure 2:
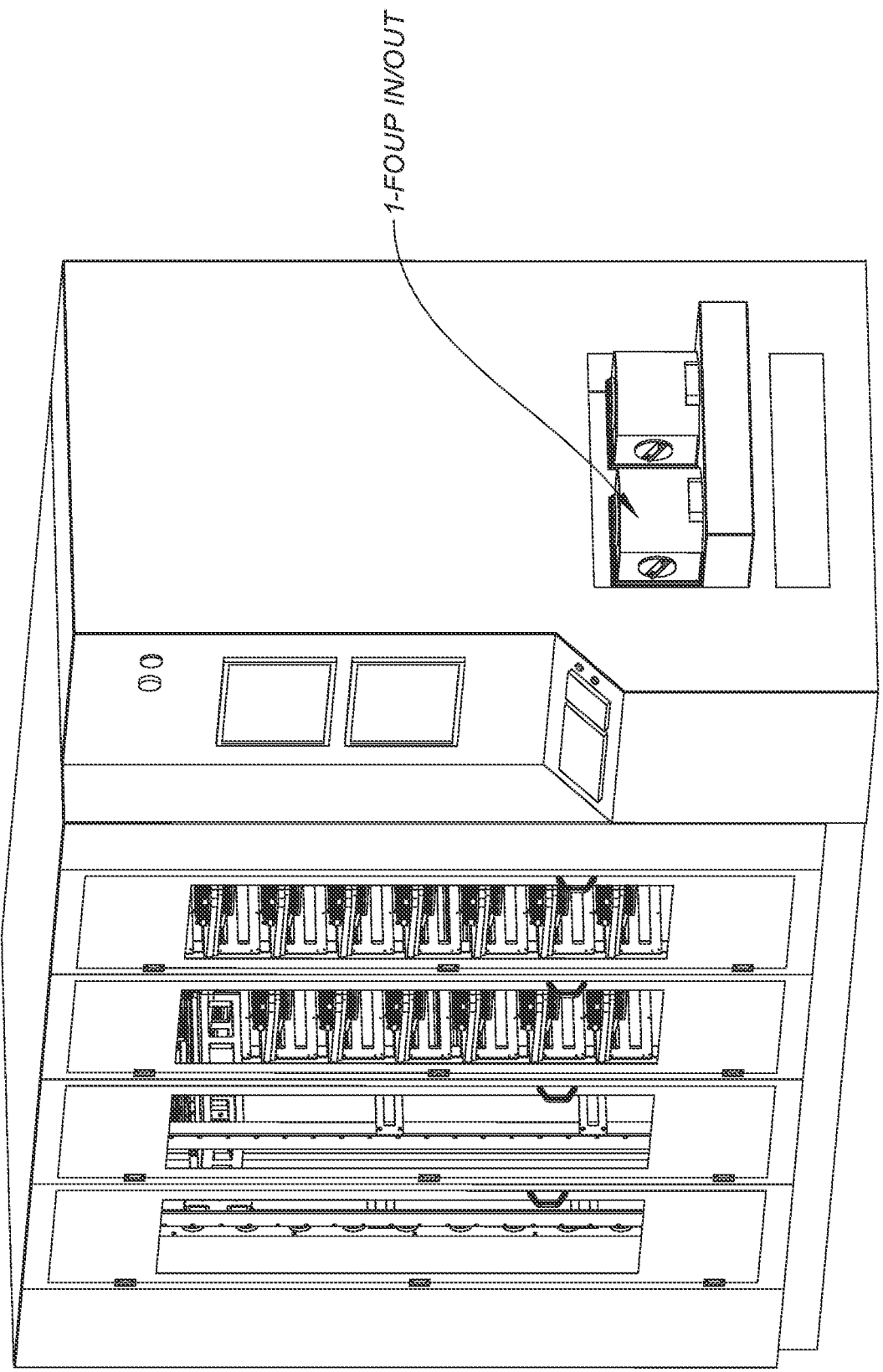
FIG. 2 illustrates a side view of the tester of FIG. 1 according to one embodiment of the present invention.

FIG. 2 illustrates a side view of the tester of FIG. 1 according to one embodiment of the present invention. As shown, a holding place for a set of front opening unified pods (FOUP) 1 is provided to load wafers into the tester.

Figure 3:
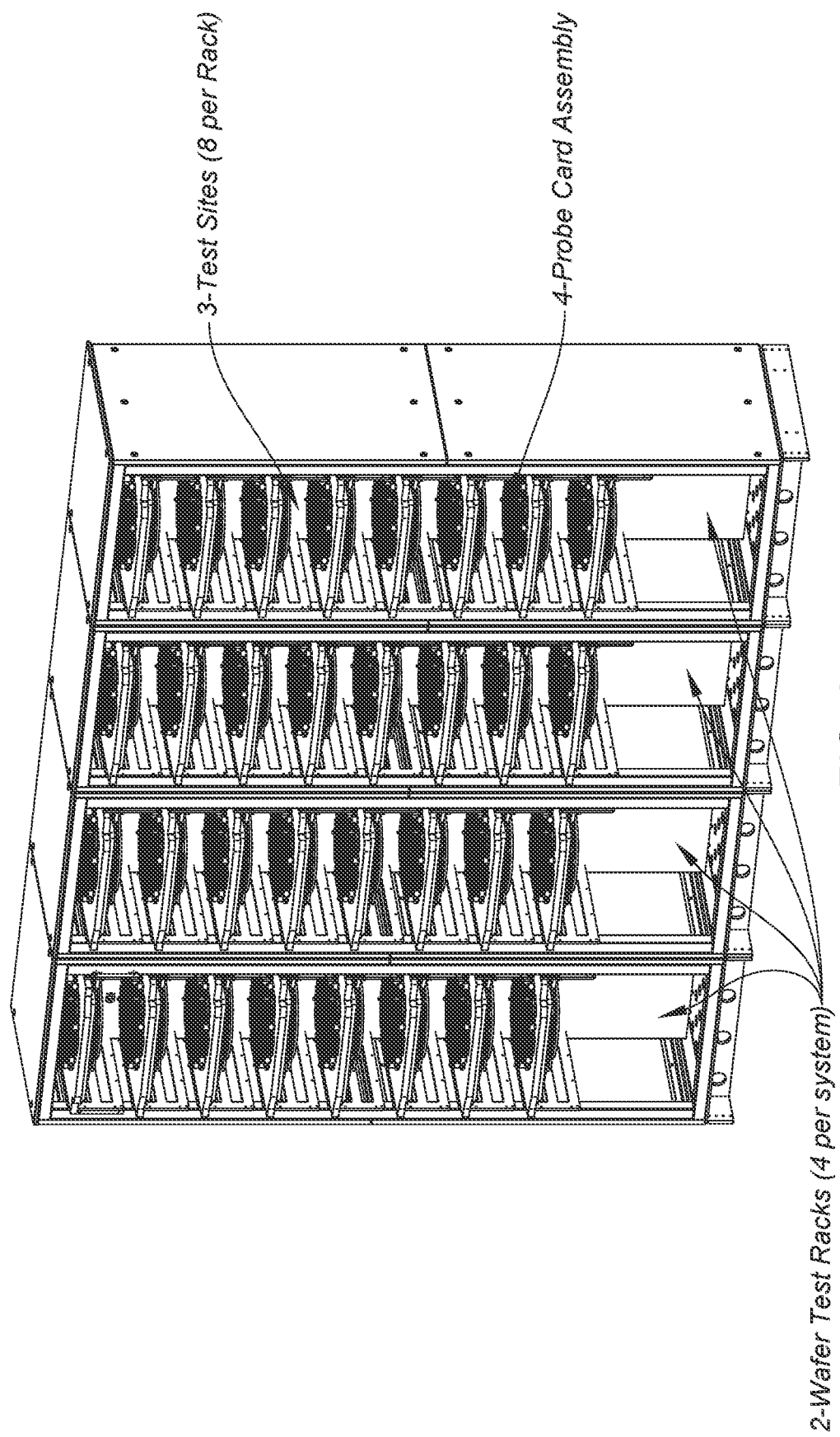
FIG. 3 illustrates a front view of an array of test sites within the tester of FIG. 1 according to one embodiment of the present invention.

FIG. 3 illustrates a front view of an array of test sites within the tester of FIG. 1 according to one embodiment of the present invention. As shown, the array of test sites is a series of individual wafer test racks 2, each having a column of individual test sites 3. As shown, there are four modular test racks 1, each having a column of eight test sites. It should be appreciated that the tester in some embodiments may contain a varying number of racks and that each rack may contain a varying number of test sites. In some embodiments, the tester may contain one, two, three, or four racks, each having a column of a given number of test sites. Also, as shown, each test site 3 contains a probe card assembly 4 for testing each wafer inserted into the test site. Each test site also contains a floating chuck 8 (shown and described below in connection with FIG. 5).

Figure 4:
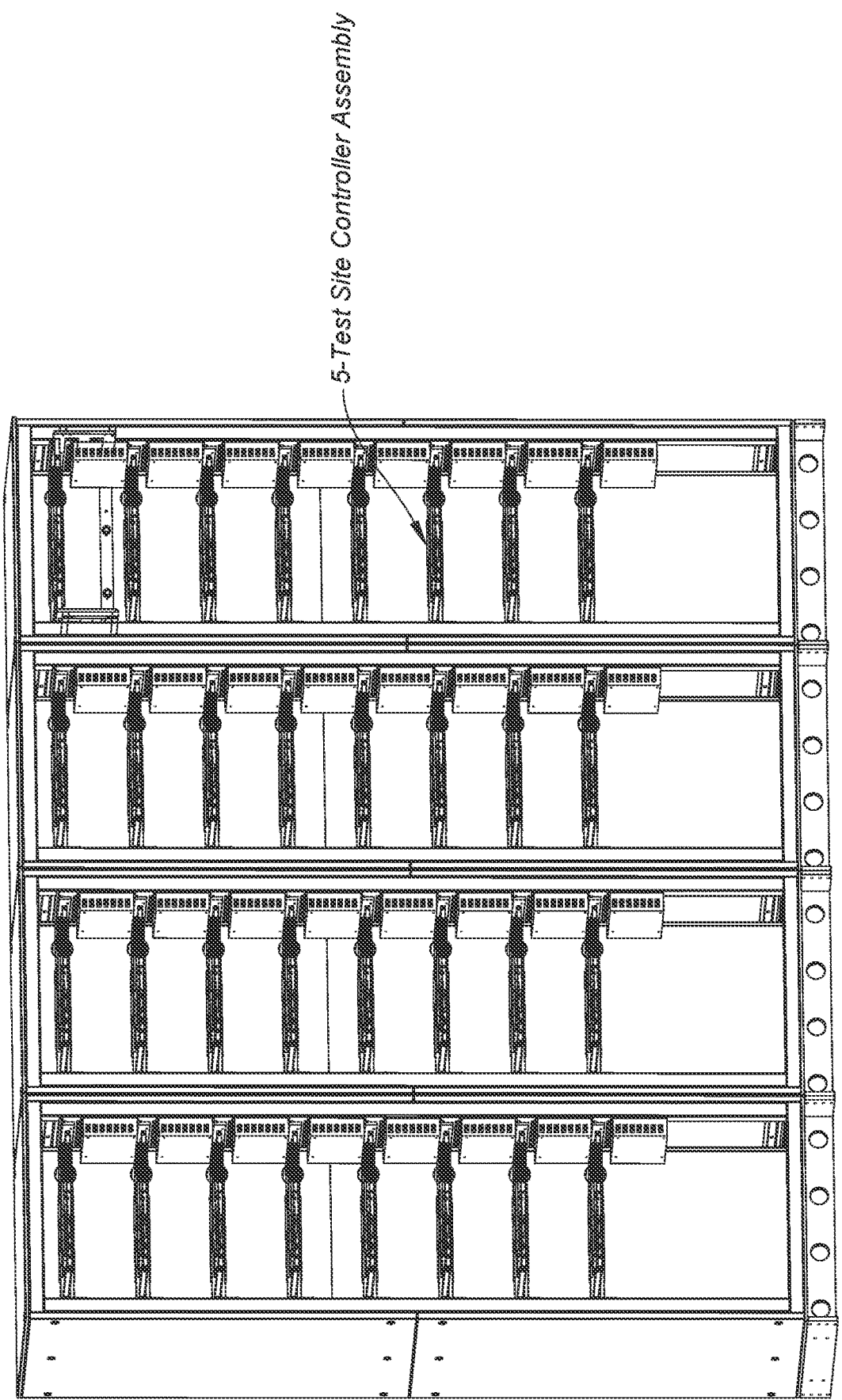
FIG. 4 illustrates a back view of the array of test sites within the tester of FIG. 3 according to one embodiment of the present invention.

FIG. 4 illustrates a back view of the array of test sites within the tester of FIG. 3 according to one embodiment of the present invention. As shown, a test site controller assembly 5 for each test site, which controls a corresponding probe card 25 (see FIG. 13), is located behind a panel that separates the test site, which is accessible from the front of the tester cabinet, from the test site controller assembly, which is accessible from behind the tester cabinet.

Figure 5:
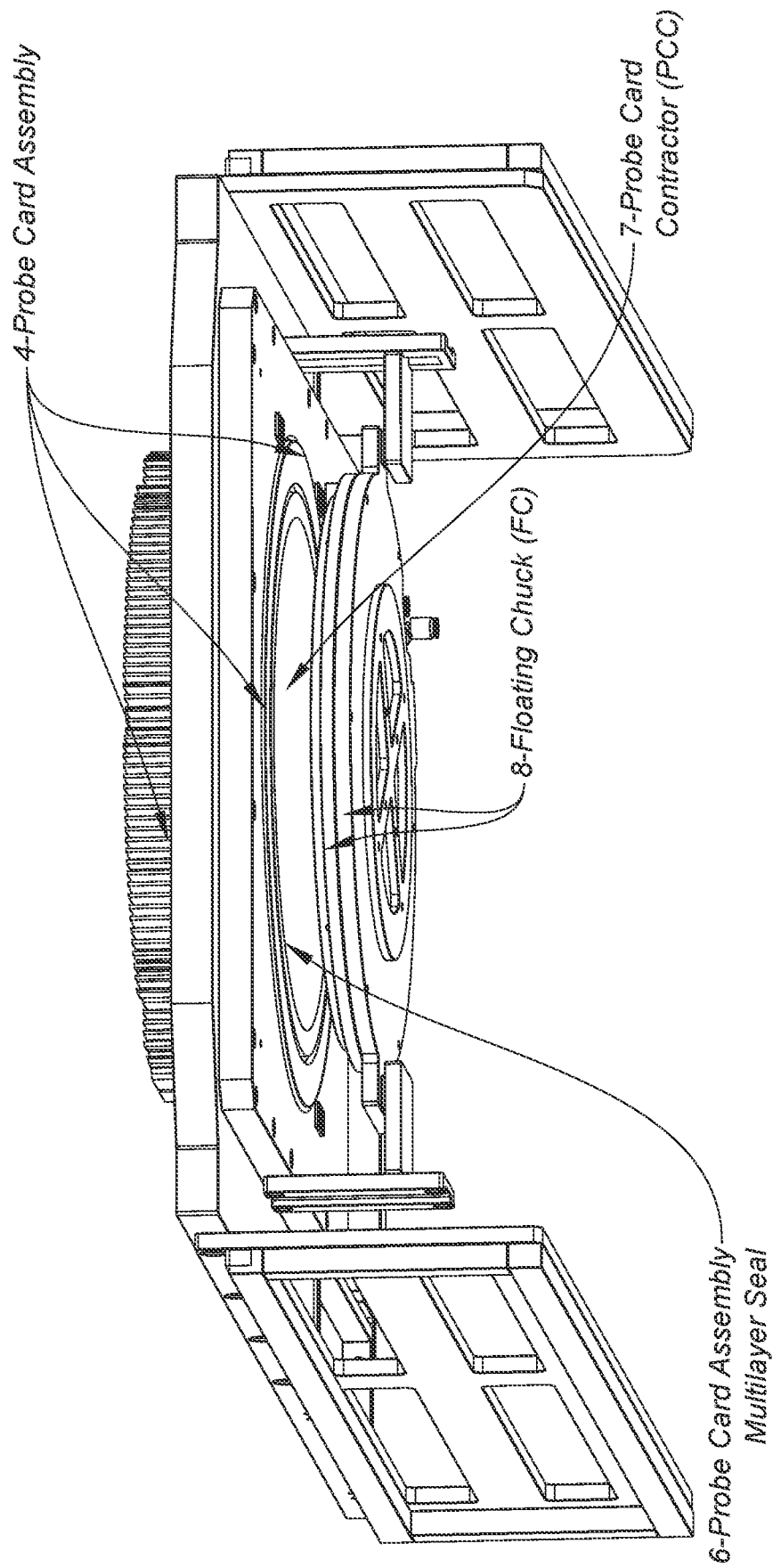
FIG. 5 illustrates a probe card assembly and a floating chuck according to one embodiment of the present invention.

FIG. 5 illustrates a probe card assembly and a floating chuck according to one embodiment of the present invention. As noted, each test site contains a probe card assembly 4 and a floating chuck 8. The floating chuck 8 is disposed below the probe card assembly 4, specifically below a probe card contactor 7. In use, the wafer to be tested will be placed on top of the floating chuck 8. Once properly aligned, as described below, the floating chuck 8 will be brought into contact with the probe card assembly 4 as to allow the wafer to be engaged by the probe card contactor 7. Accordingly, it should be appreciated that the floating chuck 4 can be moved freely in any direction, including in the X-Y directions and in the Z or vertical direction, as well as rotated, to allow itself to be captured by a wafer alignment assembly 15 (see FIG. 8), where it receives the wafer to be tested, and to be aligned, together with the wafer, with the probe card contactor 7. It should be appreciated that the floating chuck 8 is also a dual vacuum chuck, wherein a top side vacuum is used to lock the wafer in place for testing and a bottom side vacuum is used to latch itself onto the wafer alignment assembly 15 for the duration of the wafer alignment process (see FIG. 8). These features allow the floating chuck 8 to be precisely aligned, together with the wafer, with the probe card contactor 7.

Figure 6:
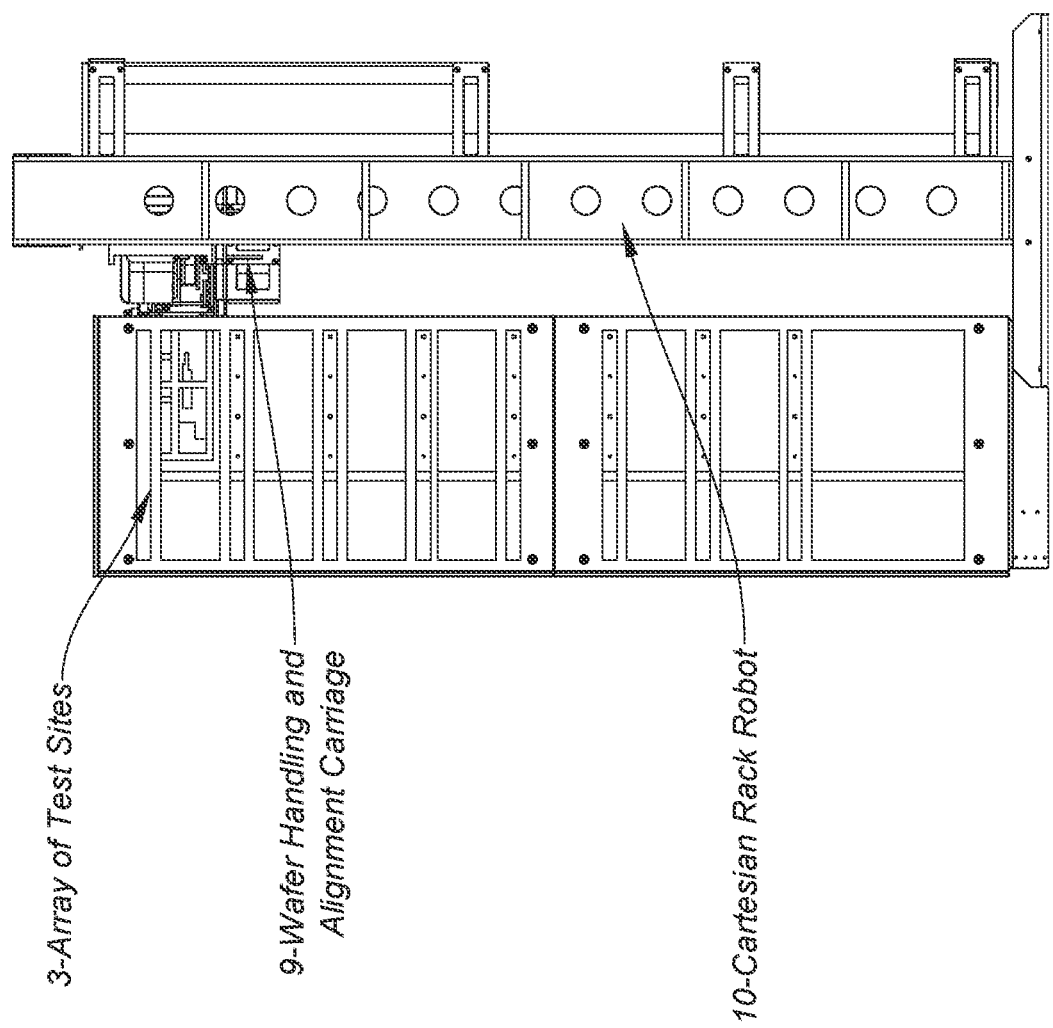
FIG. 6 illustrates a Cartesian robot for moving a wafer handling and alignment carriage from one test site to another according to one embodiment of the present invention.

FIG. 6 illustrates a Cartesian robot for moving a wafer handling and alignment carriage from one test site to another according to one embodiment of the present invention. The test racks 2 are shown from the side, and a single Cartesian rack robot 10 is mounted in front of the test racks 2 so that the test sites 3 can be accessed by the Cartesian rack robot 10. The Cartesian rack robot 10 is used to move a wafer handling and alignment carriage 9 (shown at the top of the test racks 2), from one test site to another test site. It should be appreciated that the wafer handling and alignment carriage 9 holds a wafer handling robot 11, a wafer rotation pre-alignment assembly 12, a wafer alignment assembly 15, a wafer FOUP 14, and a wafer camera assembly 13, which are described further in connection with FIGS. 7-9. The wafer handling and alignment carriage 9 and the associated wafer handling robot 11, the wafer rotation pre-alignment assembly 12, the wafer alignment assembly 15, the wafer FOUP 14, and the wafer camera assembly 13 is generally used to facilitate the movement of wafers into and from each test site and to align the wafers on the floating chuck 8 for subsequent alignment with the probe card contactor 7. It should be appreciated that the Cartesian rack robot 10 can move the wafer handling and alignment carriage 9, along with the associated wafer handling robot 11, the wafer rotation pre-alignment assembly 12, the wafer alignment assembly 15, the wafer FOUP 14, and the wafer camera assembly 13, from any given test site to any other test site as desired. The Cartesian rack robot 10 can be computer controlled to move the wafer handling and alignment carriage 9 to and from any given test site to place and retrieve wafers as necessary or as desired based upon the testing performed. Accordingly, it should be appreciated that in this embodiment, only one wafer handling and alignment carriage along with the associated wafer handling robot 11, the wafer rotation pre-alignment assembly 12, the wafer alignment assembly 15, the wafer FOUP 14, and the wafer camera assembly 13 is used for the entire array of test sites and that the Cartesian rack robot 10 moves the wafer handling and alignment carriage 9 from test site to test site as necessary.

Figure 7:
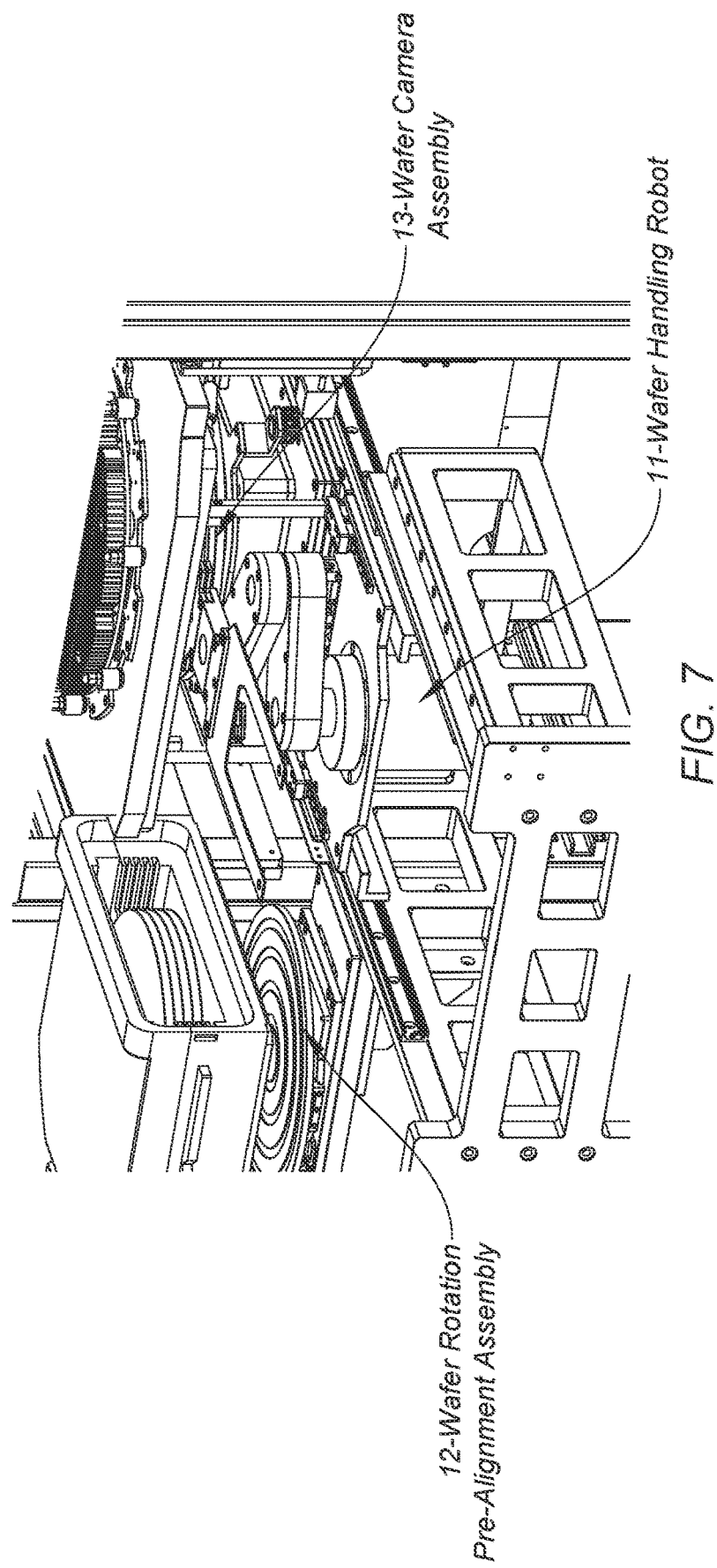
FIGS. 7-9 illustrate various views of the wafer handling and alignment carriage and associated assemblies according to one embodiment of the present invention.
Figure 8:
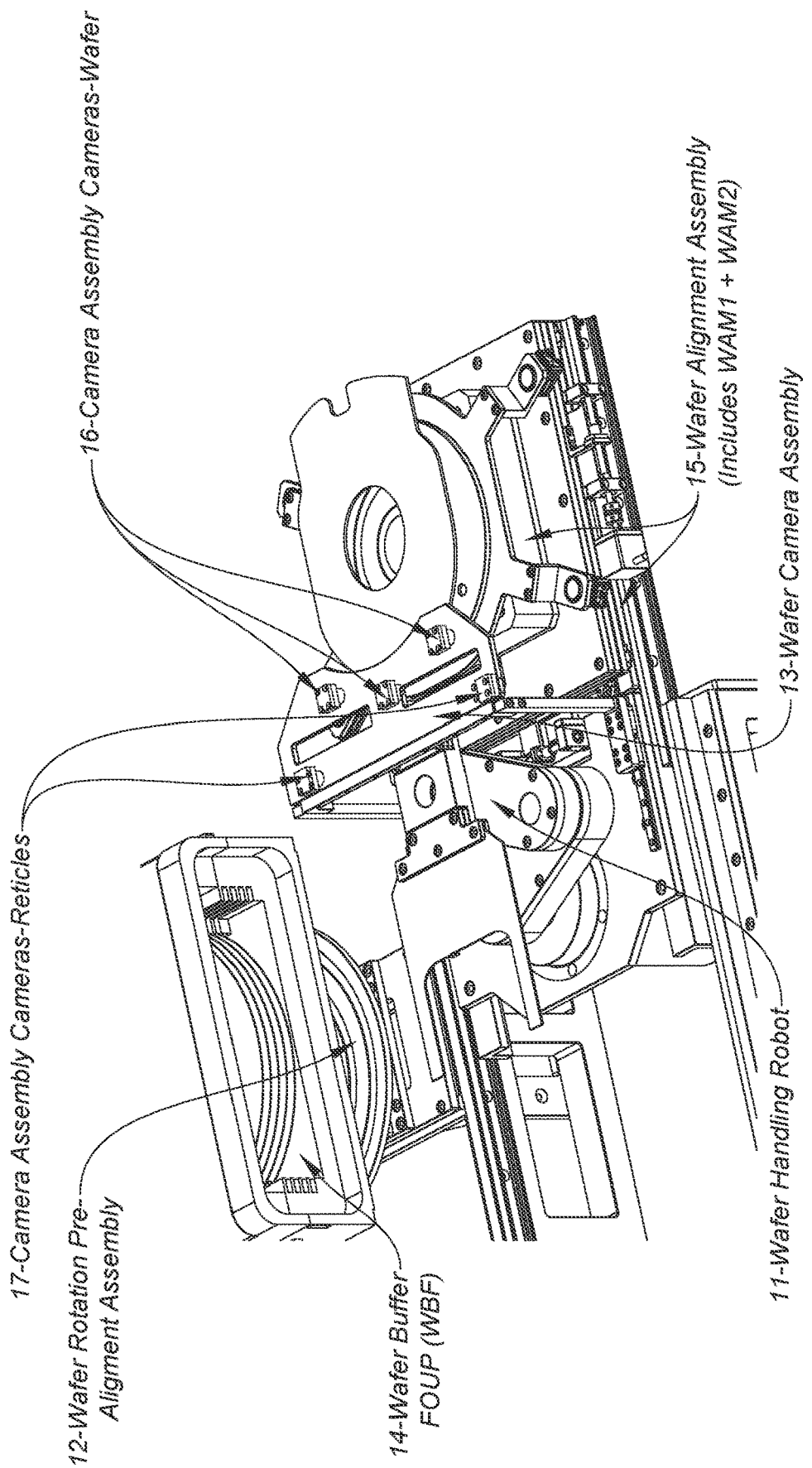
Figure 9:
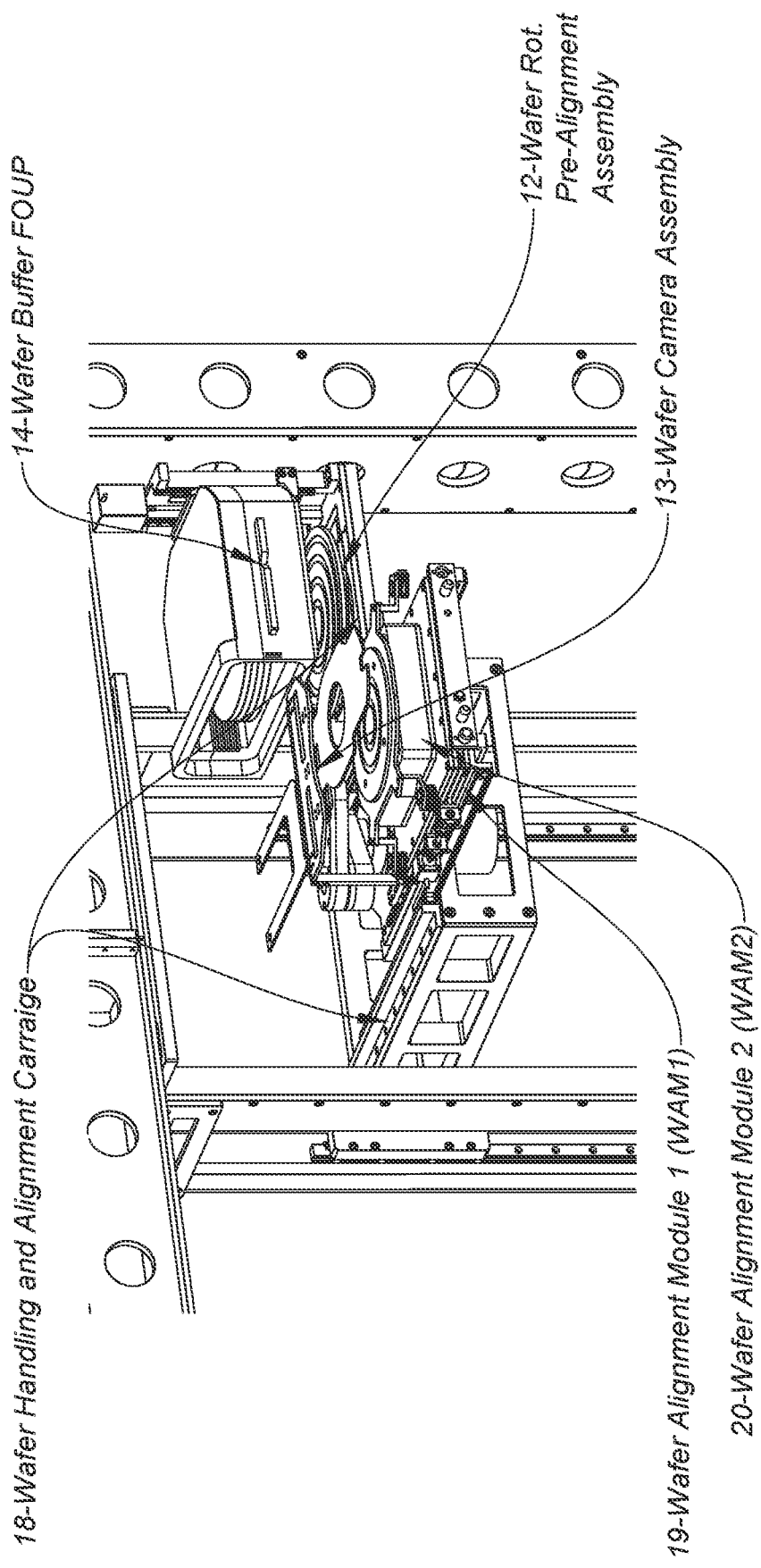

FIGS. 7-9 illustrate various views of the components of a wafer handling and alignment carriage and associated assemblies according to one embodiment of the present invention. Each of FIGS. 7-9 show a wafer buffer FOUP assembly 11 and a wafer rotation pre-alignment assembly 12. In its home position, a wafer handling robot 11 loads up to twenty-four wafers from one of the input/output FOUPs 1 to the wafer buffer FOUP 14. The wafer handling robot 11 will then place a wafer from the wafer buffer FOUP 14 on the wafer rotation pre-alignment assembly 12. Once the wafer rotation pre-alignment assembly 12 receives a wafer it will proceed with the rotational alignment of the wafer.

Figure 11:
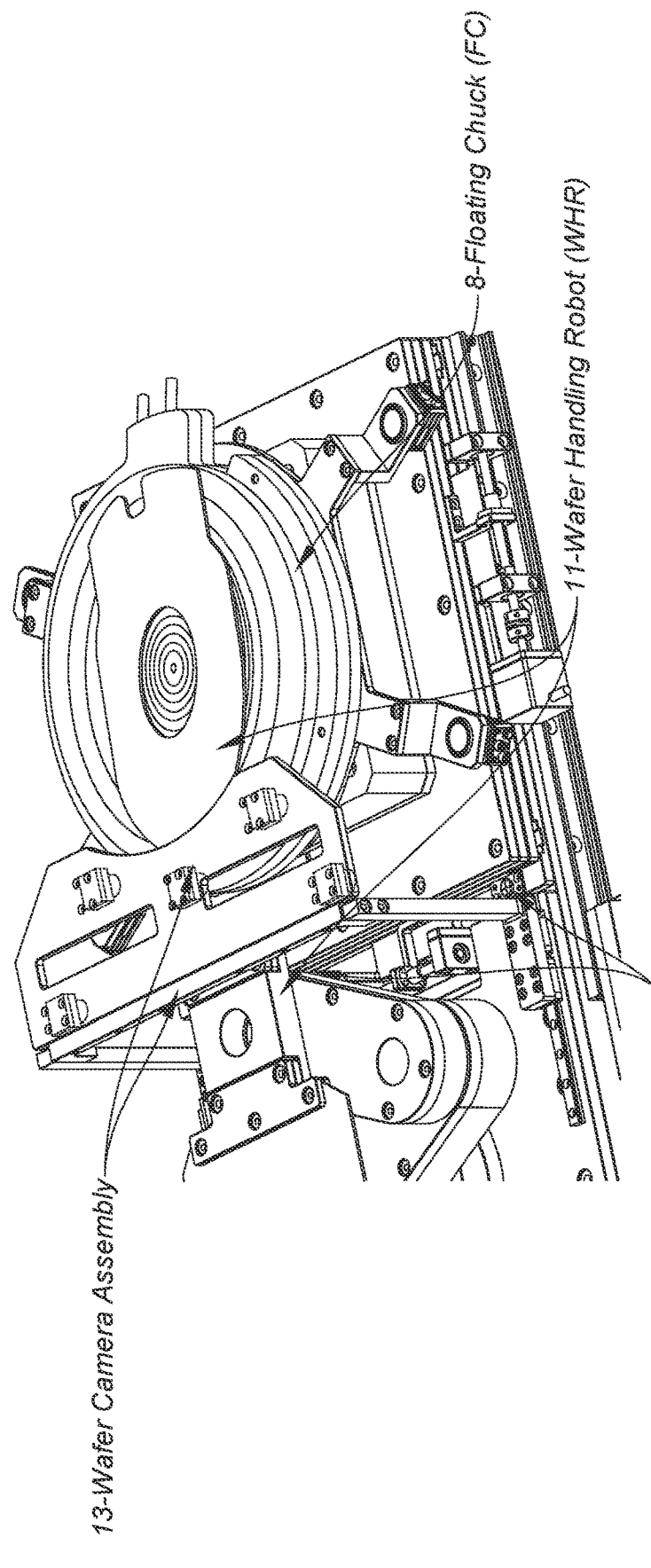
FIG. 11 illustrates a side view of the wafer alignment assembly according to one embodiment of the present invention.

The Cartesian rack robot 10 will then move to the first available test site and will dock the wafer handling and alignment carriage 9 in front of that test site. The wafer alignment assembly 15 having two wafer alignment modules 19, 20 will then be inserted inside the test site to perform wafer alignment to ultimately align the wafer with the probe card within the test site. At the same time, the wafer camera assembly 13 (see also FIG. 12) will be inserted inside the test site between the floating chuck 8 and the probe card assembly 4. (FIG. 11 illustrates the relative positions of the wafer alignment assembly 15, the wafer camera assembly 13, and the floating chuck 8, noting that all of these components at this point are positioned within a given test site.)

With the needed wafer alignment resources in place, the wafer on the wafer rotation pre-alignment assembly 12, or the pre-aligned wafer, will be moved by the wafer handling robot 11 from the wafer rotation pre-alignment assembly 12 to a position above the floating chuck 8. After that, the Z (vertical) stage of the first wafer alignment module (WAM1) 19 is activated to place the top contact platform of the wafer alignment assembly 15 in contact with the floating chuck 8. In other words, the wafer alignment assembly 15 is moved up in a vertical direction to meet the bottom of the floating chuck 8. Once in place, the floating chuck alignment assembly vacuum is turned on to latch the floating chuck 8 to the wafer alignment assembly 15, which places the wafer above the floating chuck 8.

With reference to FIG. 8, three wafer cameras 16 are mounted on the wafer camera assembly 13. Once the floating chuck 8 is held captive by the wafer alignment assembly 15, the wafer cameras 16 will feed images from the edges of the wafer and markers on the floating chuck 8 that will allow for optical alignment of the floating chuck 8 such that it will be centered under the wafer to be tested. After the alignment of the floating chuck 8 under the wafer, the wafer handling robot 11 will lower the wafer onto the floating chuck 8, and while the alignment of the floating chuck 8 with the wafer is monitored, a floating chuck wafer vacuum will be turned on to lock the wafer in place on top of the floating chuck 8.

With the wafer firmly in place on top of the floating chuck 8, wafer cameras 16 will feed images of the wafer notch and wafer outline points at +/−35 degrees, noting that different angles can be chosen. At the same time, two additional cameras 17 also mounted on the wafer camera assembly 13 and placed radially at the same +/−35 degrees but on the larger diameter, feed images of alignment reticles AR2 and AR3 22 (see FIG. 11) mounted on a wafer alignment base plate 23 of the wafer alignment assembly 15 (see FIG. 12) at the same angle and distance from the wafer alignment assembly center (home position) as these two additional wafer cameras 17 on the wafer camera assembly 13. Processing the optical alignment information will place the wafer in the center and aligned with the wafer alignment base plate 23 of the wafer alignment assembly 15.

At this point, an ultra-high resolution alignment process will start, which employs a piezo-based wafer alignment module 20, which is the second wafer alignment module mounted on top of the wafer alignment assembly 15 (see FIG. 9). This process will use the same cameras noted above to perform alignment with a precision of up to three orders of magnitude higher than the precision otherwise achieved without the piezo-based alignment module 20. The alignment will be performed for each of the X and Y directions as well as for a rotational position.

After that, the wafer alignment assembly factory X/Y/Rotation offsets of the wafer alignment assembly 15 are applied. The application of the offsets involves both wafer alignment assembly module 1 19 and wafer alignment assembly module 2 20. (Wafer alignment assembly factory X/Y/Rotation offsets are generated when the wafer alignment assembly 15 is manufactured. After the manufacturing assembly process, the wafer alignment assembly 15 is installed on a high precision optical measurement system to measure the X/Y/Rotational offsets of the wafer alignment assembly module 2 20 mounted on top of the alignment assembly module 1 19, with regards to alignment assembly reticles 22 (see FIG. 11). These offsets are then stored electronically in a wafer alignment assembly controller for later use during the wafer alignment processes.)

Next, the factory Z/Y/Rotation offsets of the probe card assembly 4 are applied. The application of the offsets involves both alignment assembly module 1 19 and wafer alignment assembly module 2 20. (Probe card assembly factory X/Y/Rotation offsets are generated when the probe card assembly 4 is manufactured. After the manufacturing assembly process, the probe card assembly 4 is installed on a high precision optical measurement system to measure the X/Y/Rotational offsets of the probe card assembly 4, with regards to the probe card assembly reticles 26. These offsets are then stored electronically in a probe card controller 24 for later use during the wafer alignment processes.)

Figure 10:
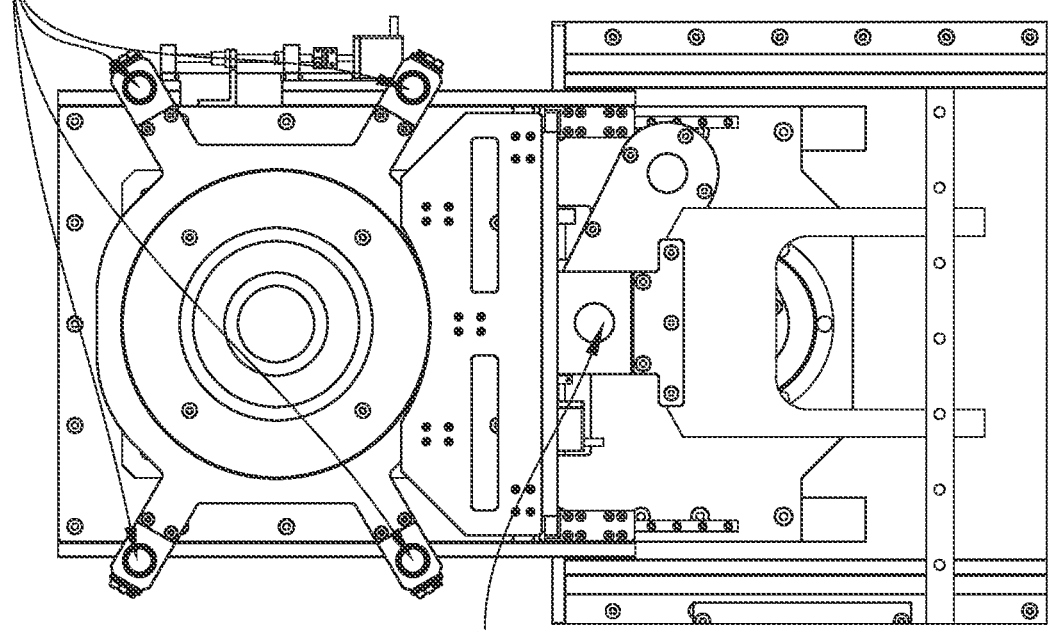
FIG. 10 illustrates a top view of the wafer alignment assembly according to one embodiment of the present invention.
Figure 12:
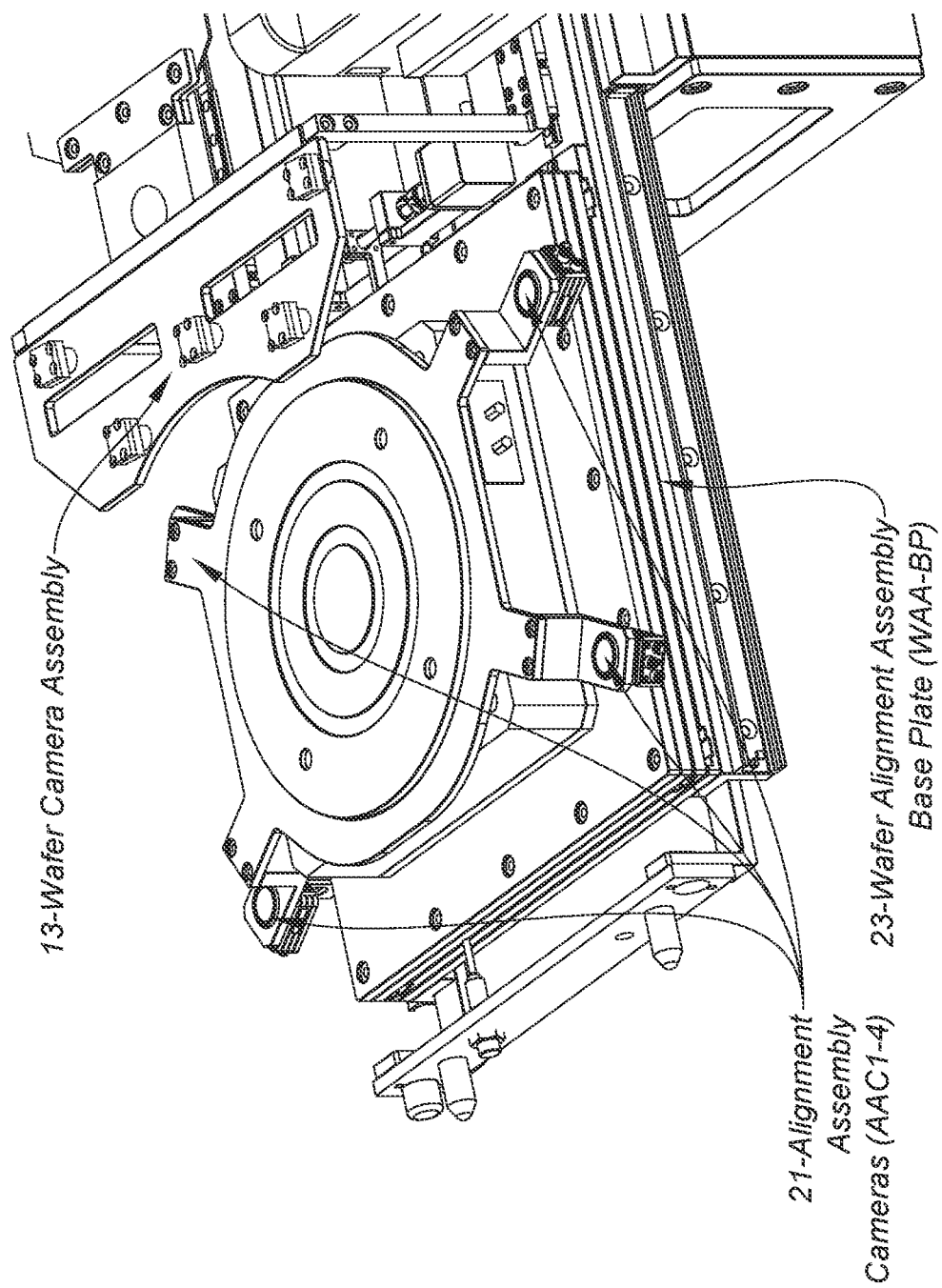
FIG. 12 illustrates another side view of the wafer alignment assembly according to one embodiment of the present invention.
Figure 13:
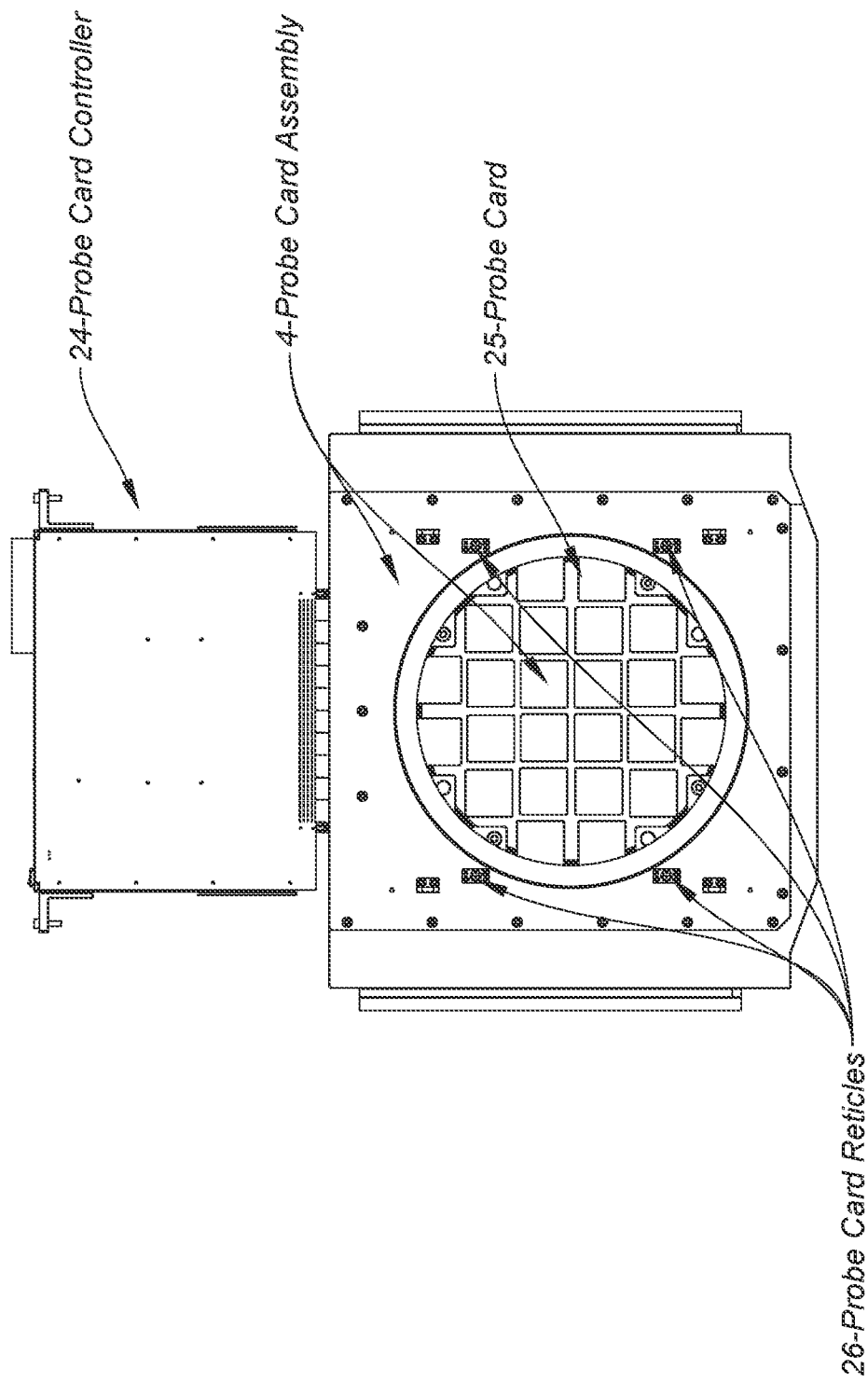
FIG. 13 illustrates a top view of the probe card assembly according to one embodiment of the present invention.

FIG. 10 illustrates a top view of the wafer alignment assembly according to one embodiment of the present invention. FIG. 11 illustrates a side view of the wafer alignment assembly of FIG. 10 according to one embodiment of the present invention. FIG. 12 illustrates another view of the wafer alignment assembly according to one embodiment of the present invention. FIG. 13 illustrates a top view of the probe card assembly according to one embodiment of the present invention.

At this point, the wafer camera assembly 13 can be retracted to its home position to clear the space between the wafer placed on the floating chuck 8 and the probe card assembly 4. Then, the alignment of the wafer mounted on the floating chuck 8 with the probe card assembly 4 is performed.

As shown in FIG. 12, four alignment assembly cameras 21 are mounted on the wafer alignment assembly 15 (see also FIG. 10). These four cameras 21 feed images of four probe card reticles 26 disposed on the bottom side of the probe card assembly 4 as shown in FIG. 13. The floating chuck 8 is aligned based on the captured images.

At this point, the piezo-based ultra-high resolution alignment process will start again, employing the second wafer alignment assembly module 2 20. This process will use the same four alignment assembly cameras 21 to perform the final alignment with a precision of up to three orders of magnitude higher. The alignment will be performed for each of the X and Y directions as well as for a rotational position.

The Z (vertical) stage of the first wafer alignment module 1 19 is activated again in order to bring the wafer in contact with the probe card contactor 7 and the floating chuck 8 in contact with the wafer probe card assembly multilayer seal 6 (see FIG. 5). Throughout this process the alignment assembly cameras 21 will continuously monitor the alignment with the four probe card reticles 26 to correct any incurred misalignment during the Z (vertical) motion.

When the wafer reaches the probe card contactor pins (contact position), the outer perimeter area of the floating chuck 8 extending beyond the size of the wafer will come in contact with the probe card assembly multilayer seal 6. The friction of the seal and the contact points will start having an effect with regards to keeping the wafer aligned. At this point, a test chamber vacuum is turned on, which will start exerting a force to press the wafer against the probe card contactor 7. However, motion in the Z (vertical) direction will continue for a determined distance, during which it will work in tandem with the vacuum to compress the contactor pins. At a given distance from the contact position, the Z motion of the first wafer alignment module 1 19 will be stopped and the floating chuck alignment assembly vacuum will be turned off to disengage the floating chuck 8 from the wafer alignment assembly 15.

A wafer die detecting routine will then be started on the wafer tester to detect the die contacts on the entire surface of the wafer. When the test position is within the expected calibrated range for the specific test site and if all die can be detected by the tester, or the test chamber vacuum is locked and monitored, and the wafer test is started. However, if the test position is reached, or the maximum test chamber vacuum is reached, or the maximum test height is reached, and not all die are detected by the die detecting routine, a determination and decision is taken if the testing should commence or if the wafer contact routine should be repeated.

Upon test start, the wafer alignment assembly 15 is being returned to the home position on the wafer handling and alignment carriage 9, and the carriage is released by the test site for serving other test sites. During the time the wafer test is being performed, the test chamber vacuum is precisely monitored and kept at the same level, as to assure no Z-movement of the floating chuck 8. At the completion of the wafer test, the wafer handling and alignment carriage 9 is requested to return to the test site for service. At the same time the test chamber vacuum is gradually reduced as to allow the floating chuck 8 to disengage from the probe card assembly 4. The test chamber vacuum is reduced up to a minimum level as to allow the floating chuck 8 to stabilize at a test terminate position where it will wait to be picked up by the wafer alignment assembly 15 and lowered to the floating chuck home position for pickup by the wafer handling robot 11.

Figure 14:
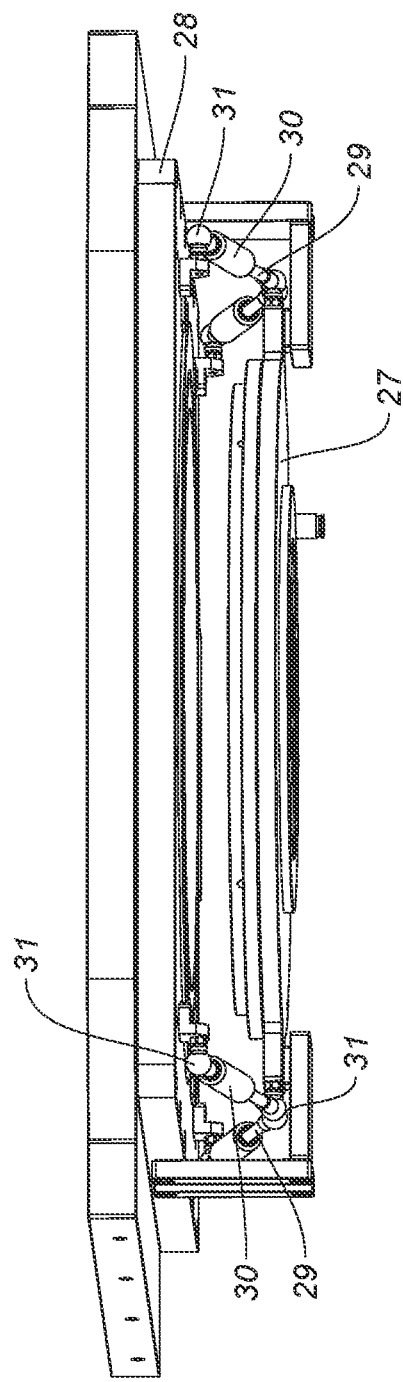
FIG. 14 illustrates a floating chuck according to another embodiment of the present invention.

FIG. 14 illustrates a floating chuck according to another embodiment of the present invention. A floating chuck 27 is attached to a probe card assembly plate 28 through the use of two sets of dual ball joint damper assemblies 29. Each dual ball joint damper assembly 29 includes two dampers 30 with ball joints 31 at each end. One end of each assembly 29 is attached to the probe card assembly plate 28 and the other end is attached to the floating chuck 27. In use, this embodiment allows for smoother alignment of the floating chuck, compared having a floating chuck supported by, for example, a roller guide and air cylinders. When not engaged, the floating chuck 27 is resting in its home position as shown.

Figure 15:
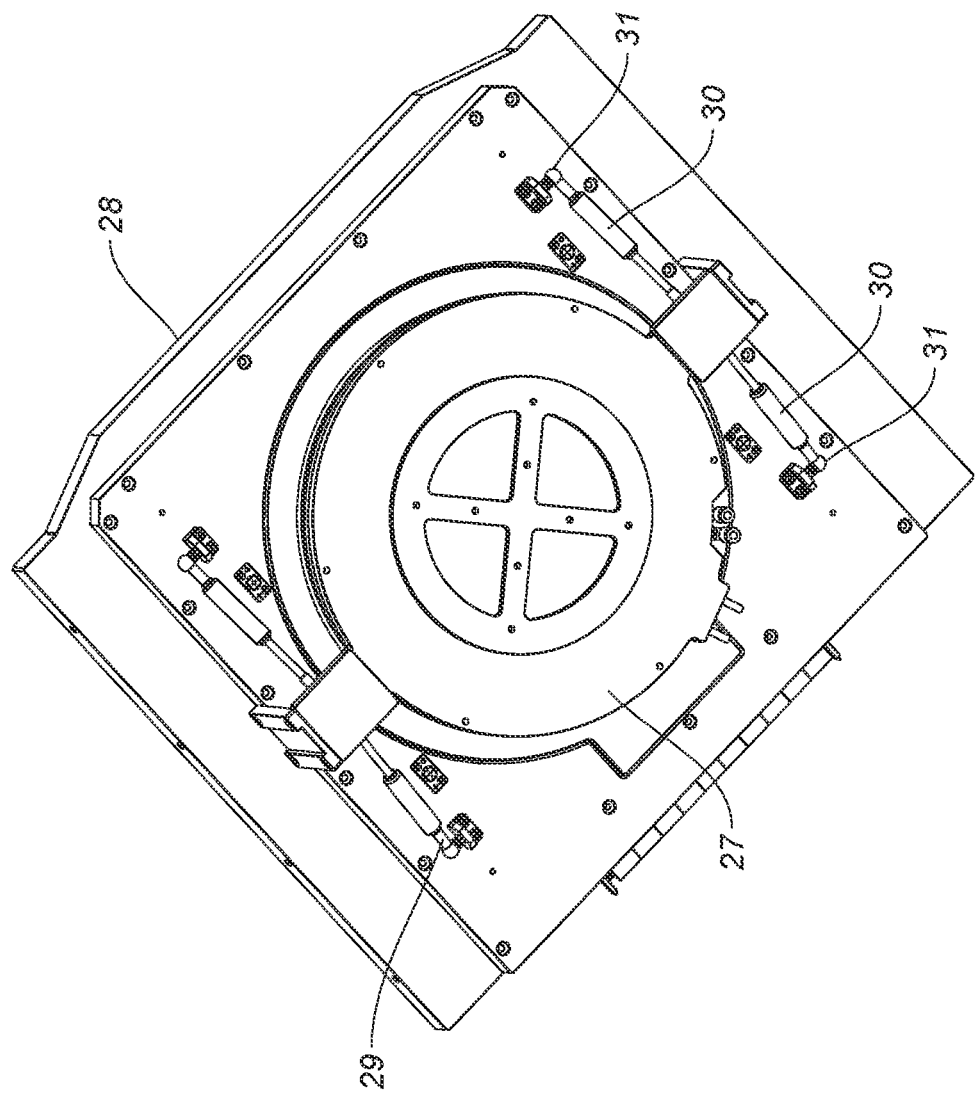
FIG. 15 illustrates a bottom perspective view of the floating chuck of FIG. 14.

FIG. 15 illustrates a bottom perspective view of the floating chuck of FIG. 14. As shown, the floating chuck 27 is attached to the probe card assembly plate 28 using the two sets of dual ball joint damper assemblies 29, each having two dampers 30 and ball joints 31 at each end.

Various embodiments of the invention have been described above. However, it should be appreciated that alternative embodiments are possible and that the invention is not limited to the specific embodiments described above.

What is claimed is:

1. A system for testing a plurality of wafers, comprising:
 a two-dimensional array of wafer test sites, arranged vertically and horizontally, wherein each of said wafer test sites comprises:
  a probe card assembly;
  a corresponding probe card controller configured to test a wafer; and
  a chuck configured to hold the wafer against said probe card assembly;
 a movable carriage configured to move the wafer into and from any one of said wafer test sites and to align the wafer with said probe card assembly, wherein said movable carriage comprises:
  a receptacle configured to hold the wafer before testing;

a first alignment assembly configured to align the wafer rotationally;
a first robot configured to retrieve the wafer from said receptacle and to place the wafer on said first alignment assembly and to move the wafer from said first alignment assembly to a position above said chuck; and
a second alignment assembly configured to move in at least an X/Y/Z direction to hold said chuck, to align said chuck with the wafer, and to align the wafer on said chuck with said corresponding probe card assembly; and
a second robot configured to move said movable carriage to any one of said wafer test sites and to place said movable carriage at least partially within said any one of said wafer test sites.

2. The system of claim 1, further comprising:
a first vacuum to secure said chuck against said second alignment assembly;
a second vacuum to secure the wafer against said top surface of said chuck; and
a third vacuum to secure the wafer against said probe card assembly.

3. The system of claim 1, wherein said receptacle comprises a receptacle for holding a plurality of wafers.

4. The system of claim 1, wherein said movable carriage further comprises:
a plurality of cameras for aligning said chuck with the wafer.

5. The system of claim 4, wherein said plurality of cameras are disposed on a retractable assembly to move said plurality of cameras toward and away from said second alignment assembly.

6. The system of claim 1, wherein said movable carriage further comprises:
a plurality of cameras for aligning said chuck and the wafer with said probe card assembly.

7. The system of claim 1, wherein said second alignment assembly comprises:
a first alignment module; and
a second alignment module disposed on top of said first alignment module.

8. The system of claim 7, wherein said first alignment module and said second alignment module move vertically to align and attach a top surface of said second alignment module with a bottom surface of said chuck, wherein said first alignment module and said second alignment module move vertically to align and attach said top surface of said chuck with a bottom surface of the wafer, and wherein said first alignment module and said second alignment module move vertically to align and attach a top surface of the wafer with a bottom surface of said probe card assembly.

9. The system of claim 1, wherein said second robot moves said movable carriage inside of any one of said wafer test sites.

10. The system of claim 1, wherein said chuck remains within said test site during operation.

11. The system of claim 1, wherein said second alignment assembly configured to move in a rotational direction.

12. A system for aligning a wafer with a probe card assembly for testing, comprising:
a chuck disposed within a test site configured to hold a wafer against a probe card assembly, wherein said chuck remains within the test site; and
a movable carriage configured to align said chuck while holding the wafer with the probe card assembly, wherein said movable carriage comprises:
a first alignment assembly configured to align the wafer rotationally;
a first robot configured to place the wafer on said first alignment assembly and to move the wafer from said first alignment assembly to a top surface of said chuck; and
a second alignment assembly configured to hold said chuck and align said chuck with the wafer and to align the wafer on said chuck with the probe card assembly; wherein said second alignment assembly comprises:
a first alignment module; and
a second alignment module disposed on top of said first alignment module,
wherein said first alignment module and said second alignment module move vertically to align and attach a top surface of said second alignment module with a bottom surface of said chuck, wherein said first alignment module and said second alignment module move vertically to align and attach said top surface of said chuck with a bottom surface of the wafer, and wherein said first alignment module and said second alignment module move vertically to align and attach a top surface of the wafer with a bottom surface of the probe card assembly.

13. A system for aligning a wafer with a probe card assembly for testing, comprising:
a chuck disposed within a test site configured to hold a wafer against a probe card assembly, wherein said chuck remains within the test site;
a movable carriage configured to align said chuck while holding the wafer with the probe card assembly, wherein said movable carriage comprises:
a first alignment assembly configured to align the wafer rotationally;
a first robot configured to place the wafer on said first alignment assembly and to move the wafer from said first alignment assembly to a top surface of said chuck; and
a second alignment assembly configured to hold said chuck and align said chuck with the wafer and to align the wafer on said chuck with the probe card assembly;
a first vacuum to secure the wafer against said top surface of said chuck;
a second vacuum to secure said chuck against said second alignment assembly; and
a third vacuum to secure the wafer against the probe card assembly.

14. A system for testing a plurality of wafers, comprising:
an array of wafer test sites, wherein each of said wafer test sites comprises:
a probe card assembly;
a corresponding probe card controller configured to test a wafer; and
a chuck configured to hold the wafer against said probe card assembly;
a movable carriage configured to move the wafer into and from any one of said wafer test sites and to align the wafer with said probe card assembly, wherein said movable carriage comprises:
a receptacle configured to hold the wafer before testing;
a first alignment assembly configured to align the wafer rotationally;
a first robot configured to retrieve the wafer from said receptacle and to place the wafer on said first alignment assembly and to move the wafer from said first alignment assembly to a position above said chuck; and a second alignment assembly configured to hold said chuck, to align said chuck with the wafer, and to align the wafer on said chuck with said corresponding probe card assembly;

a second robot configured to move said movable carriage to any one of said wafer test sites;

a first vacuum to secure said chuck against said second alignment assembly;

a second vacuum to secure the wafer against said top surface of said chuck; and a third vacuum to secure the wafer against said probe card assembly.

* * * * *